US008085104B2

(12) United States Patent
Lin et al.

(10) Patent No.: US 8,085,104 B2
(45) Date of Patent: Dec. 27, 2011

(54) OSCILLATION CIRCUIT, DRIVING CIRCUIT THEREOF, AND DRIVING METHOD THEREOF

(75) Inventors: Yu-Tong Lin, Hsinchu County (TW); Yun-Chieh Chen, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 144 days.

(21) Appl. No.: 12/500,845

(22) Filed: Jul. 10, 2009

(65) Prior Publication Data

US 2010/0264999 A1 Oct. 21, 2010

(30) Foreign Application Priority Data

Apr. 16, 2009 (TW) .............................. 98112684 A

(51) Int. Cl.
*H03B 5/08* (2006.01)
(52) U.S. Cl. ........... 331/173; 331/55; 331/172; 331/1 A; 375/369
(58) Field of Classification Search .................... 331/55, 331/172, 173, 1 A; 375/369
See application file for complete search history.

(56) References Cited

U.S. PATENT DOCUMENTS

| 6,670,860 | B2 * | 12/2003 | Kobayashi et al. ........... 331/158 |
|-----------|------|---------|-------------------------------------|
| 7,245,166 | B2 * | 7/2007  | Kurachi et al. ............... 327/198 |
| 7,492,231 | B2 * | 2/2009  | Nagatomo et al. ............ 331/158 |
| 7,576,617 | B2 * | 8/2009  | Itagaki et al. .................... 331/49 |
| 2003/0076146 | A1 * | 4/2003 | Carragher et al. ............ 327/291 |
| 2003/0098733 | A1 * | 5/2003 | Saita ............................. 327/291 |
| 2006/0017518 | A1 * | 1/2006 | Wilcox ......................... 331/185 |
| 2008/0238564 | A1 * | 10/2008 | Sprouse ....................... 331/183 |

* cited by examiner

*Primary Examiner* — Arnold Kinkead
*Assistant Examiner* — Richard Tan
(74) *Attorney, Agent, or Firm* — J.C. Patents

(57) ABSTRACT

An oscillation circuit, a driving circuit thereof, and a driving method thereof are provided. The driving circuit generates a second enable signal according to an output signal of an oscillator and a first enable signal. The second enable signal is transmitted to the oscillator. When a number of waves of the output signal within a predetermined period is smaller than a predetermined value, the driving circuit adjusts a voltage level of the second enable signal. A voltage level of the first enable signal is equal to an enable voltage level. Through variations in voltage levels of the second enable signal, the oscillator is triggered to oscillate.

21 Claims, 6 Drawing Sheets

OSCILLATION CIRCUIT, DRIVING CIRCUIT THEREOF, AND DRIVING METHOD THEREOF

CROSS-REFERENCE TO RELATED APPLICATION

This application claims the priority benefit of Taiwan application serial no. 98112684, filed Apr. 16, 2009. The entirety of the above-mentioned patent application is hereby incorporated by reference herein and made a part of specification.

BACKGROUND

1. Technology Field

The present invention generally relates to an oscillation circuit, and more particularly, to an oscillation circuit capable of being certainly triggered, a driving circuit thereof, and a driving method thereof.

2. Description of Related Art

With the progress of technology, electronic products with better performance have been developed, and normal operation of the electronic products relies on an oscillator providing a clock signal. Through the exact clock signal generated by the oscillator, data and signals received by chips inside the electronic products can be sequentially processed and transmitted to circuits at the next stage at the right time.

FIG. 1 is a schematic view of a conventional oscillator 60. As indicated in FIG. 1, the oscillator 60 has an enable end 16 and an output end 18. The enable end 16 is used to receive an enable signal ENin, and the output end 18 is used to output an output signal CK. Generally, when the enable signal ENin stays at a low voltage level, the oscillator 60 stays at a disable state, but when the enable signal ENin stays at a high voltage level, the oscillator 60 stays at an enable state. Accordingly, when the oscillator 60 is required to oscillate, the enable signal ENin is raised from the low voltage level to the high voltage level, so that the oscillator 60 can be triggered to oscillate, and further the output signal CK is able to become a clock signal. However, the quality of the oscillator 60 is the key point to determine whether the oscillator 60 is triggered to oscillate or not. Specifically, for the oscillator having poor quality, when the voltage level of the enable signal ENin is high, the oscillator 60 may not be triggered to oscillate, so that the output signal CK is not a desired clock signal. However, when the output signal CK is not a clock signal, elements of which normal operation counts on the clock signal output by the oscillator 60 can no longer be normally operated.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

One embodiment of the present invention provides a driving circuit which adjusts a voltage level of an enable signal of an oscillator so as to certainly trigger the oscillator to oscillate.

One embodiment of the present invention provides an oscillation circuit of which an oscillator is certainly triggered to oscillate.

One embodiment of the present invention provides a driving method by which an oscillator is certainly triggered to oscillate, and the oscillator further outputs a required pulse signal.

One embodiment of the present invention provides a driving circuit adapted to trigger an oscillator to oscillate. The driving circuit has a control unit, a first input end, a second input end, and an output end. The first input end of the driving circuit is coupled to the control unit and receives a first enable signal. The second input end of the driving circuit is coupled to the control unit and receives an output signal of the oscillator. The output end of the driving circuit is coupled to the control unit and an enable end of the oscillator to transmit a second enable signal generated by the control unit to the oscillator. The control unit generates the second enable signal according to the first enable signal and the output signal. When a number of waves of the output signal within a predetermined period is smaller than a predetermined value, the control unit adjusts a voltage level of the second enable signal.

One embodiment of the present invention provides an oscillation circuit. The oscillation circuit has an oscillator and a driving circuit. The oscillator outputs an output signal. The driving circuit has a control unit, a first input end, a second input end, and an output end. The first input end of the driving circuit is coupled to the control unit and receives a first enable signal. The second input end of the driving circuit is coupled to the control unit and receives the output signal. The output end of the driving circuit is coupled to an enable end of the oscillator to transmit a second enable signal generated by the control unit to the oscillator. The control unit generates the second enable signal according to the first enable signal and the output signal. When a number of waves of the output signal within a predetermined period is smaller than a predetermined value, the control unit adjusts a voltage level of the second enable signal.

One embodiment of the present invention provides a driving method for triggering an oscillator to oscillate. The driving method comprises following steps. A first input end of a driving circuit is used to receive a first enable signal. A second input end of the driving circuit is used to receive an output signal of the oscillator. A control unit of the driving circuit is enabled according to the first enable signal, so that the control unit generates a second enable signal according to the first enable signal and the output signal. The second enable signal is transmitted from an output end of the driving circuit to the oscillator. When a number of waves of the output signal within a predetermined period is smaller than a predetermined value, the control unit adjusts a voltage level of the second enable signal.

According to the oscillation circuit, the driving circuit thereof, and the driving method thereof as disclosed in embodiments of the present invention, the oscillator is certainly triggered to oscillate by adjusting the voltage level of the enable signal of the oscillator, and the oscillator further outputs the required pulse width signal.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
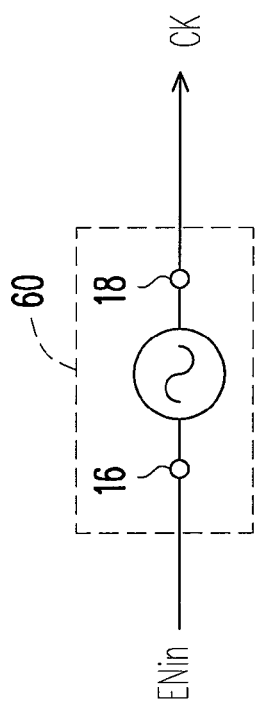
FIG. 1 is a schematic view of a conventional oscillator.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
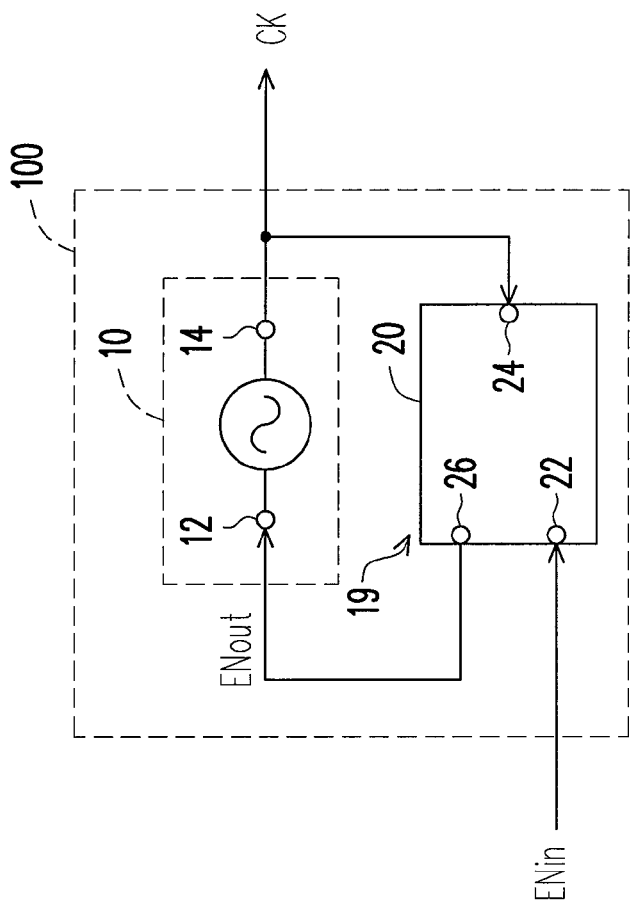
FIG. 2 is a block diagram of an oscillation circuit according to an embodiment of the present invention.

FIG. 2 is a block diagram of an oscillation circuit 100 according to an embodiment of the present invention. Referring to FIG. 2, the oscillation circuit 100 has an oscillator 10 and a driving circuit 19. The oscillator 10 has an enable end 12 and an output end 14. The driving circuit 19 has a control unit 20, a first input end 22, a second input end 24, and an output end 26. The first input end 22 is coupled to the control unit 20 and used to receive a first enable signal ENin. The second input end 24 is coupled to the control unit 20 and used to receive an output signal CK which is outputted by the output end 14 of the oscillator 10. The output end 26 is coupled to the enable end 12 of the oscillator 10 and used to transmit a second enable signal ENout, which is generated by the control unit 20, to the oscillator 10. The control unit 20 generates the second enable signal ENout according to the first enable signal ENin and the output signal CK of the oscillator 10. When a voltage level of the first enable signal ENin is equal to a disable voltage level, such as a low voltage level, the control unit 20 does not work. However, when the voltage level of the first enable signal ENin is switched from the disable voltage level to an enable voltage level, such as a high voltage level, the control unit 20 is enabled to detect the output signal CK of the oscillator 10, so as to determine whether the control unit 20 adjusts a voltage level of the second enable signal ENout or not. Specifically, when the voltage level of the first enable signal ENin is equal to the above-described enable voltage level, if the control unit 20 detects a number of waves of the output signal CK of the oscillator 10 within a predetermined period is smaller than a predetermined value, it means that not only the output signal CK is an undesired clock signal, but also the oscillator 10 does not successfully oscillate yet. Under such a condition, the control unit 20 adjusts the voltage level of the second enable signal ENout, so that the oscillator 10 starts to oscillate due to a variation of the voltage level of the second enable signal ENout.

Figure 3:
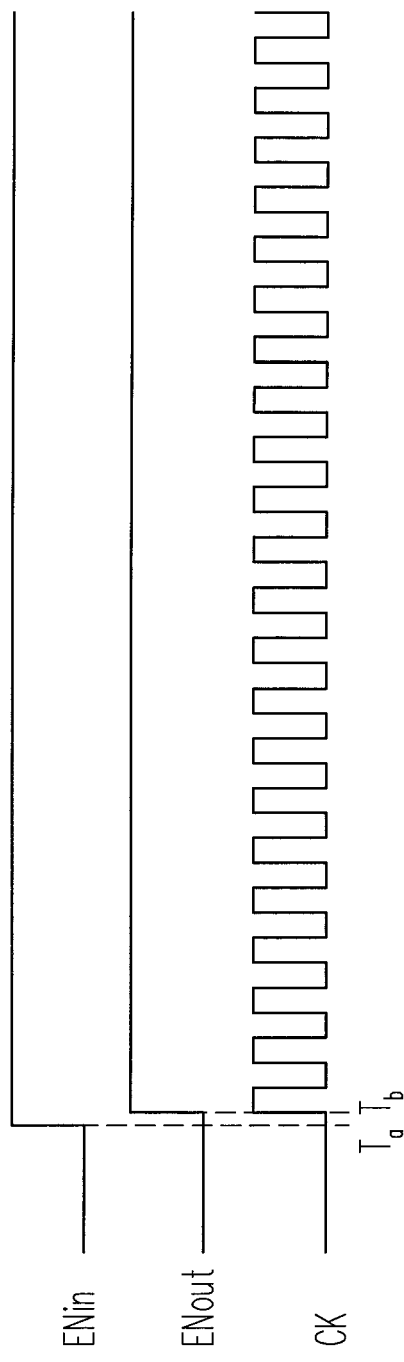
FIG. 3 is a timing diagram of each of the signals of the oscillation circuit in FIG. 2 to illustrate that the oscillator is successfully triggered to oscillate when the second enable signal ENout is raised to the enable voltage level for the first time.

FIG. 3 is a timing diagram of signals of the oscillation circuit 100 shown in FIG. 2. Referring to FIG. 2 and FIG. 3, when the oscillator 10 successfully oscillates at start, waveforms of the first enable signal ENin, the second enable signal ENout, and the output signal CK are shown in FIG. 3. Here, at a time $T_a$, the first enable signal ENin is raised from the low voltage level to the high voltage level. Thereafter, the control unit 20 outputs the second enable signal ENout according to the first enable signal ENin and the output signal CK. Since the control unit 20 has response time, when the first enable signal ENin is raised to the high voltage level, the second enable signal ENout is raised from the low voltage level (the disable voltage level) to the high voltage level (the enable voltage level) at a time $T_b$, and the oscillator 10 stays at an enable state. As shown in FIG. 3, when the second enable signal ENout is raised to the high voltage level at the time $T_b$, the oscillator 10 is successfully triggered to oscillate. Furthermore, the output signal CK after the time $T_b$ is a pulse signal. That is, after the time $T_b$, the output signal CK has a plurality of pulses.

Figure 4:
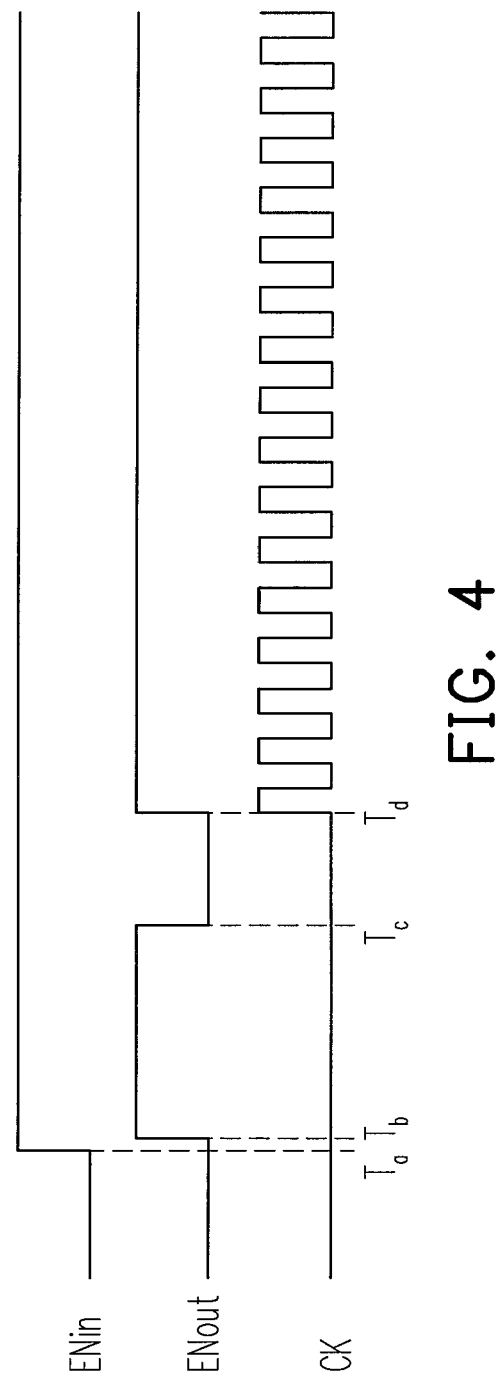
FIG. 4 is a timing diagram of each of the signals of the oscillation circuit in FIG. 2 to illustrate that the oscillator is not successfully triggered to oscillate when the second enable signal ENout is raised to the enable voltage level for the first time.

In FIG. 2, when the second enable signal ENout is raised to the high voltage level, the oscillator 10 is successfully triggered to oscillate. On the contrary, in another case, when the second enable signal ENout is raised to the high voltage level, the oscillator 10 is not successfully triggered to oscillate. FIG. 4 illustrates that the oscillator 10 is not successfully triggered to oscillate when the second enable signal ENout is raised to the high voltage level for the first time. Referring to FIG. 4, at the time $T_a$, the first enable signal ENin is raised from the low voltage level to the high voltage level. Thereafter, due to the delayed response of the control unit 20 to a signal, the second enable signal ENout is raised from the low voltage level to the high voltage level at the time $T_b$ posterior to the time $T_a$. After the time $T_b$, the control unit 20 detects the output signal CK of the oscillator 10 to determine whether the control unit 20 adjusts the voltage level of the second enable signal ENout or not. Specifically, during a predetermined period from the time $T_b$ to a time $T_c$, the control unit 20 detects a number of waves of the output signal CK. When the number of waves of the output signal CK within the predetermined period is smaller than a predetermined value, the control unit 20 adjusts the voltage level of the second enable signal ENout. As shown in FIG. 4, during the predetermined period from the time $T_b$ to the time $T_c$, since the number of waves of the output signal CK detected by the control unit 20 is zero, it means that the oscillator 10 is not successfully triggered to oscillate. Accordingly, the control unit 20 lowers the voltage level of the second enable signal ENout from the high voltage level to the low voltage level and again raises the voltage level of the second enable signal ENout from the low voltage level to the high voltage level at a later time $T_d$. When the voltage level of the second enable signal ENout changes, the oscillator 10 may be triggered to oscillate due to the variation of the voltage level of the second enable signal ENout. As shown in FIG. 4, at the time $T_d$, after the second enable signal ENout is switched to the high voltage level, the oscillator 10 is triggered to oscillate, so that the output signal CK is the required pulse signal.

In the above-described embodiment, during the predetermined period from the time $T_b$ to the time $T_c$, when the number of waves of the output signal CK detected by the control unit 20 is smaller than the predetermined value, the control unit 20 generates a pulse of the second enable signal ENout during a period from the time $T_c$ to the time $T_d$, so that the voltage level of the second enable signal ENout changes. However, the method of adjusting the voltage level of the second enable signal ENout is not limited herein. For example, during the period from the time $T_c$ to the time $T_d$ in FIG. 4, the control unit 20 may further adjust the voltage level of the second enable signal ENout more frequently.

Figure 5:
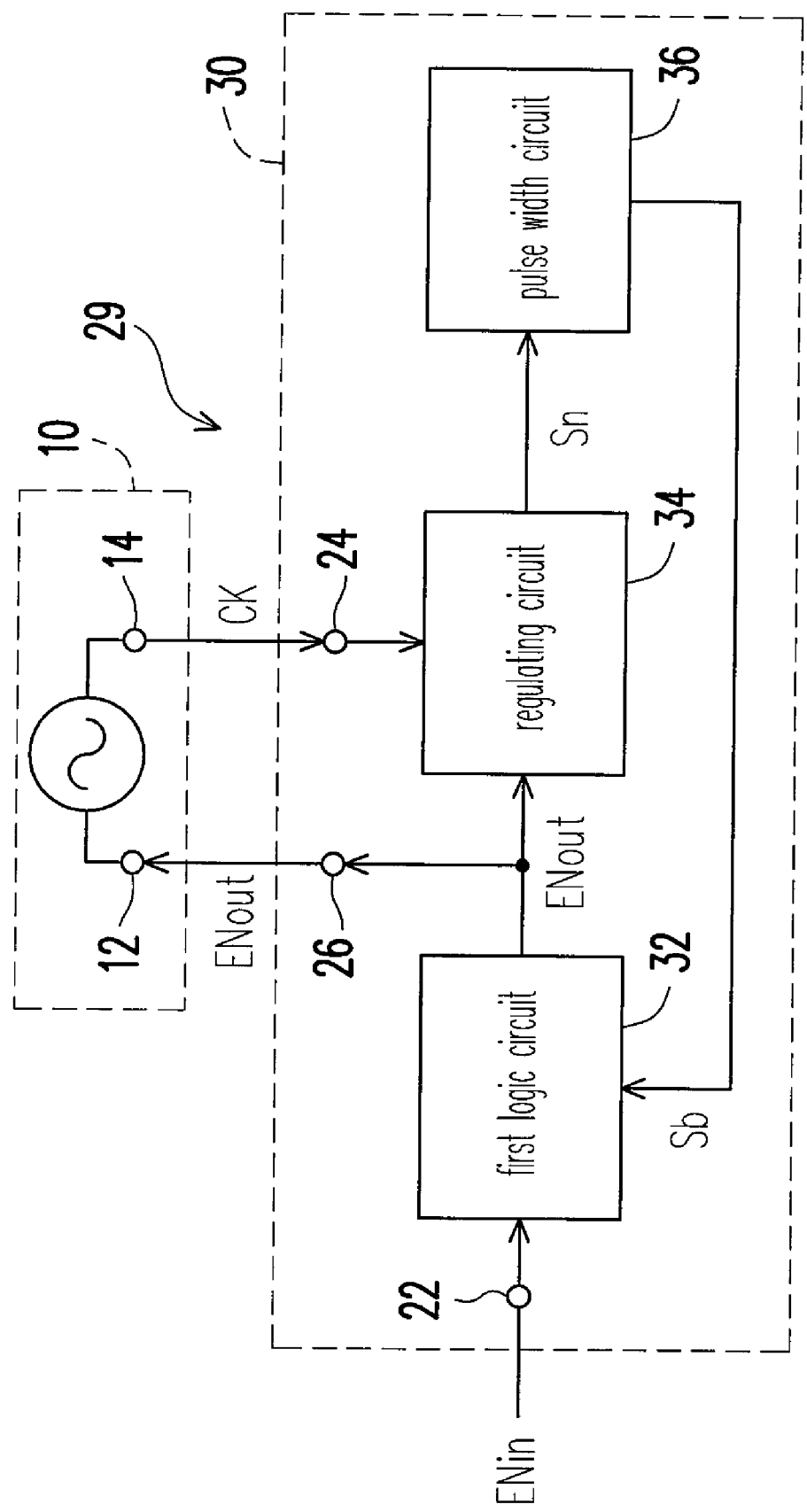
FIG. 5 is a block diagram of an oscillation circuit according to another embodiment of the present invention.

FIG. 5 is a block diagram of an oscillation circuit according to another embodiment of the present invention. Referring to FIG. 5, in the present embodiment, the oscillation circuit has the above-described oscillator 10 and a driving circuit 29. Similar to the driving circuit 19 shown in FIG. 2, the driving circuit 29 shown in FIG. 5 also has a control unit 30, a first input end 22, a second input end 24, and an output end 26. The method of connecting each end in the driving circuit 29 of the present embodiment to the oscillator 10 is the same as the method of connecting each of the ends in the driving circuit 19, shown in FIG. 2, to the oscillator 10. Accordingly, it is not described in detail herein. The control unit 30 has a first logic circuit 32, a regulating circuit 34, and a pulse width circuit 36. The first logic circuit 32 has two input ends and one output end, wherein one of the two input ends of the first logic circuit 32 receives the first enable signal ENin, and the other one of the two input ends receives a pulse width signal Sb. The first logic circuit 32 performs a logic operation according to the first enable signal ENin and the pulse width signal Sb, so as to output the second enable signal ENout from the output end of the first logic circuit 32. In the present embodiment, the first logic circuit 32, for example, is a NAND gate, so as to perform an AND operation according to the first enable signal ENin and the pulse width signal Sb.

The regulating circuit 34 has two input ends and one output end. One of the two input ends of the regulating circuit 34 is coupled to the output end of the first logic circuit 32 so as to receive the second enable signal ENout, and the other one of the two input ends of the regulating circuit 34 is coupled to the oscillator 10 so as to receive the output signal CK. The regulating circuit 34 generates and outputs a regulating signal Sn according to the output signal CK and the second enable signal ENout. Here, whether a voltage level of the regulating signal Sn changes is determined upon whether the output signal CK is a pulse signal, and therefore the regulating signal Sn serves as a basis of determining whether the number of waves of the output signal CK within the predetermined period is smaller than the predetermined value by the control unit 30.

Moreover, the pulse width circuit 36 converts the regulating signal Sn from the regulating circuit 34 to the pulse width signal Sb. An input end of the pulse width circuit 36 is coupled to the output end of the regulating circuit 34, and an output end of the pulse width circuit 36 outputs the pulse width signal Sb to the first logic circuit 32. The function of the pulse width circuit 36 mainly lies in determining the width of a part of the pulses of the second enable signal ENout. As shown in FIG. 4, the period from the time $T_c$ to the time $T_d$ is determined by the pulse width circuit 36.

Figure 6:
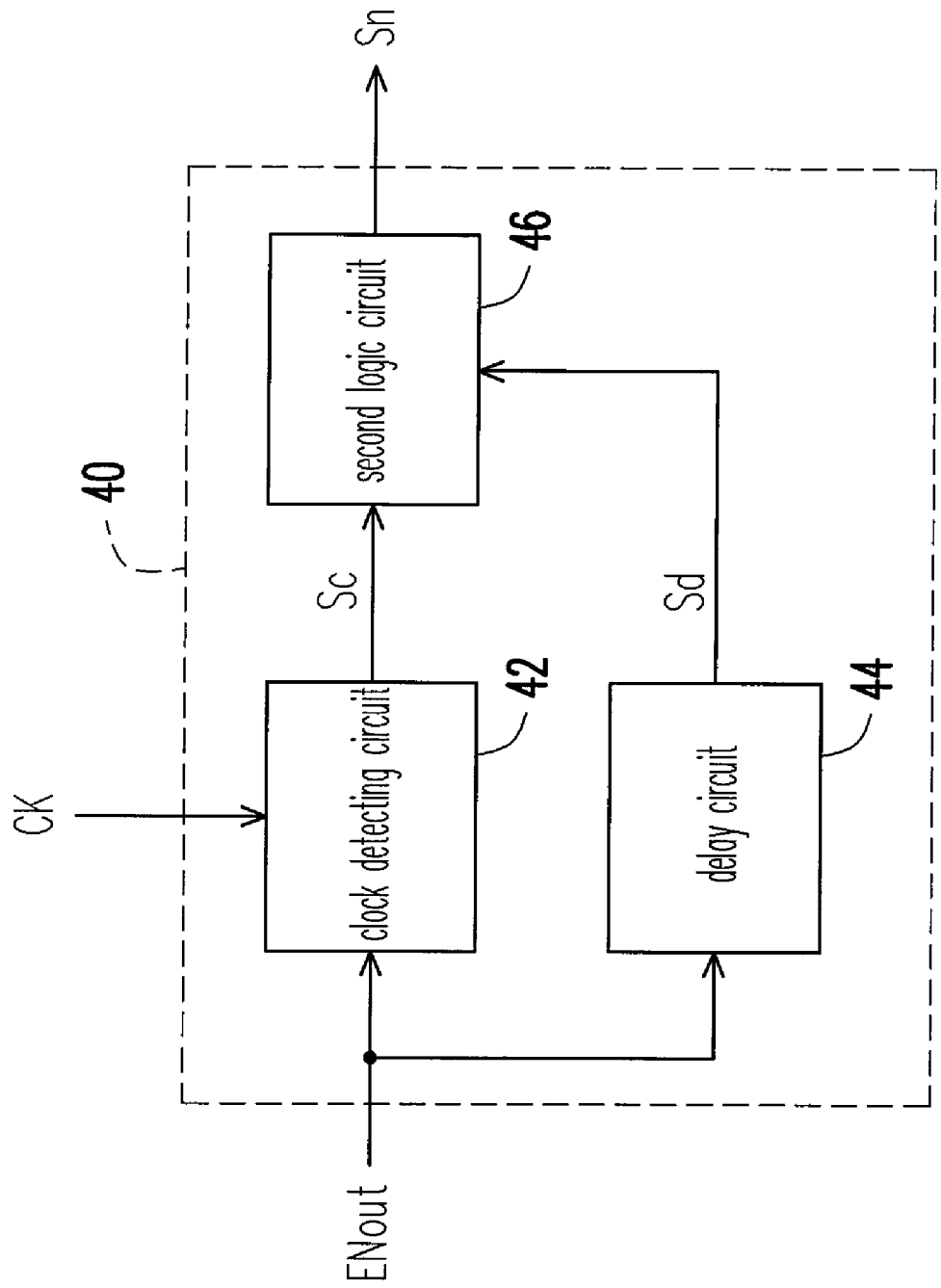
FIG. 6 is a block diagram of a regulating circuit of an oscillation circuit according to another embodiment of the present invention.

FIG. 6 is a block diagram of a regulating circuit 40 in the oscillation circuit according to another embodiment of the present invention. Referring to FIG. 6, the function of the regulating circuit 40 is the same as the function of the regulating circuit 34 in FIG. 5, and both of the regulating circuits 40 and 34 generate and output the regulating signal Sn according to the output signal CK and the second enable signal ENout. The regulating circuit 40 has a clock detecting circuit 42, a delay circuit 44, and a second logic circuit 46. The clock detecting circuit 42 has two input ends and one output end. One of the two input ends of the regulating circuit 42 is coupled to the output end of the first logic circuit 32 so as to receive the second enable signal ENout, and the other one of the two input ends of the regulating circuit 32 is coupled to the oscillator 10 so as to receive the output signal CK. The clock detecting circuit 42 detects whether the number of waves of the output signal CK within the predetermined period is smaller than the predetermined value according to the second enable signal ENout and outputs a detection result signal Sc from the output end of the clock detecting circuit 42 according to a detection result. Moreover, the delay circuit 44 delays the second enable signal ENout to output a delay signal Sd. The second logic circuit 46 has two input ends and one output end. One of the two input ends of the second logic circuit 46 receives the detection result signal Sc, and the other one of the two input ends of the second logic circuit 46 receives the delay signal Sd. The second logic circuit 46 performs another logic operation according to the detection result signal Sc and the delay signal Sd so as to output the regulating signal Sn from the output end of the second logic circuit 46. In the present embodiment, the second logic circuit 46, for example, is a NAND gate, such that the NAND operation can be performed according to the detection result signal Sc and the delay signal Sd.

Figure 7:
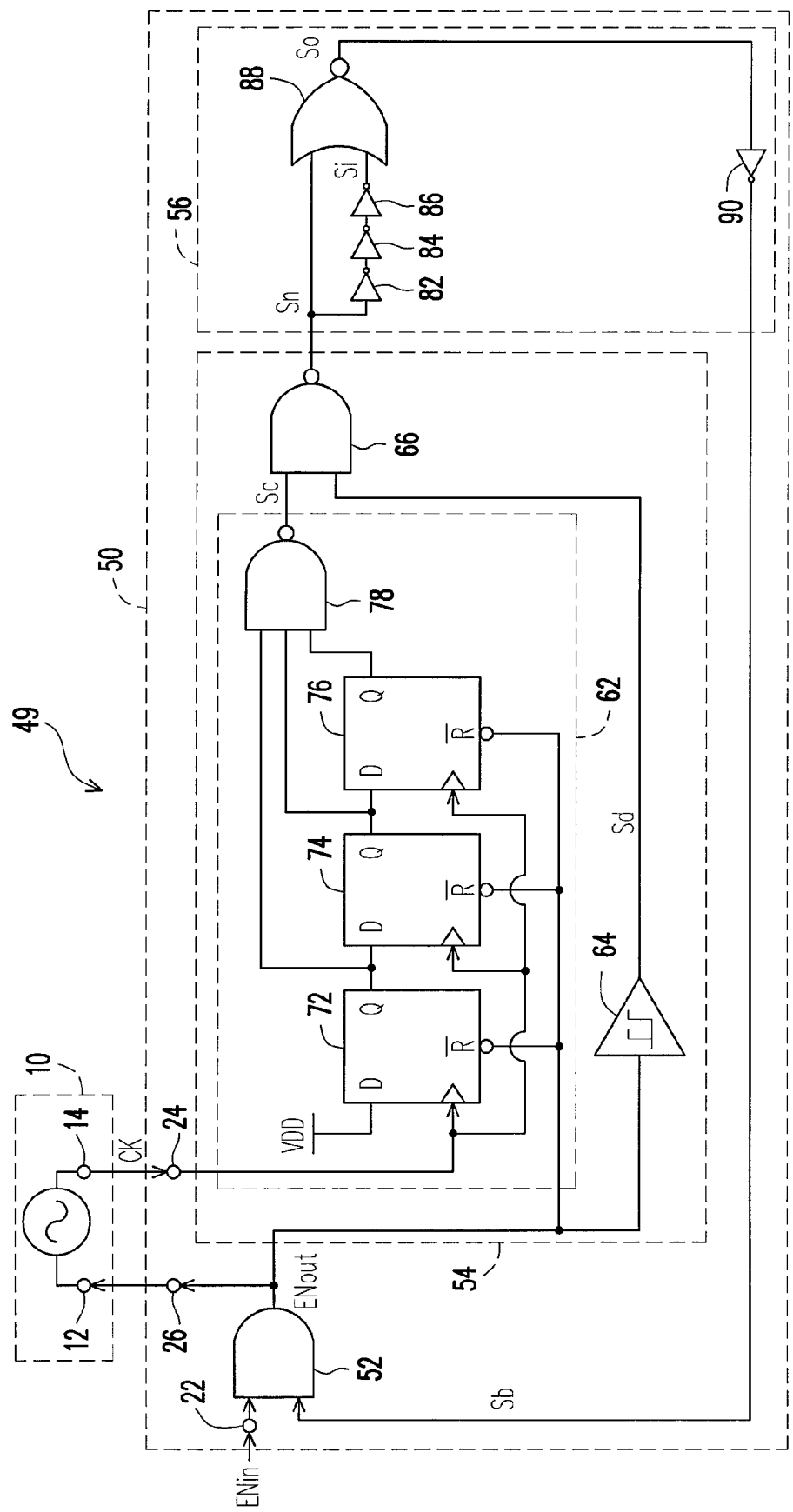
FIG. 7 is a block diagram of an oscillation circuit according to another embodiment of the present invention.

FIG. 7 is a block diagram of an oscillation circuit according to another embodiment of the present invention. Referring to FIG. 7, in the present embodiment, the oscillation circuit has the above-described oscillator 10 and a driving circuit 49. Similar to the driving circuit 19 shown in FIG. 2, the driving circuit 49 of the present embodiment also has a control unit 50, a first input end 22, a second input end 24, and an output end 26. Here, the method of connecting each end in the driving circuit 49 of the present embodiment to the oscillator 10 is the same as the method of connecting each of the ends in the driving circuit 49, shown in FIG. 2, to the oscillator 10. Accordingly, it is not described in detail herein. The control unit 50 has a first logic circuit 52, a regulating circuit 54, and a pulse width circuit 56. The first logic circuit 52 is an AND gate of which the two input ends respectively receive the first enable signal ENin and the pulse width signal Sb. The first logic circuit 52 performs an AND operation according to the first enable signal ENin and the pulse width signal Sb.

The function of the regulating circuit 54 is the same as the function of the regulating circuit 34 in FIG. 5, and both of the regulating circuits 54 and 34 generate and output the regulating signal Sn according to the output signal CK and the second enable signal ENout. The regulating circuit 54 has a clock detecting circuit 62, a delay circuit 64, and a second logic circuit 66. The function of the clock detecting circuit 62 is the same as the function of the clock detecting circuit 42 in FIG. 6. That is, the clock detecting circuit 62 detects whether the number of waves of the output signal CK within the predetermined period is smaller than the predetermined value or not according to the second enable signal ENout and outputs the detection result signal Sc from the output end of the clock detecting circuit 62 according to a detection result.

The delay circuit 64 delays the second enable signal ENout to output a delay signal Sd. The second logic circuit 66 is a NAND gate and performs a NAND operation according to the detection result signal Sc and the delay signal Sd so as to output the regulating signal Sn from the output end of the second logic circuit 66.

The clock detecting circuit 62 has a third logic circuit 78 and three D flip-flops 72, 74, and 76. The third logic circuit 78 is a NAND gate of which three input ends are respectively coupled to output ends Q of the D flip-flops 72, 74, and 76. Accordingly, the third logic circuit 78 performs the NAND operation according to signals outputted from the D flip-flops 72, 74, and 76. A reset end $\overline{R}$ of each of the D flip-flops 72, 74, and 76 receives the second enable signal, and a clock input end of each of the D flip-flops 72, 74, and 76 receives the output signal CK. A data input end D of the D flip-flop 72 is coupled to a voltage source VDD, and an output end Q of the D flip-flop 72 is coupled to a data input end D of the D flip-flop 74 and the third logic circuit 78. An output end Q of the D flip-flop 74 is coupled to a data input end D of the D flip-flop 76 and the third logic circuit 78. It should be noted that, the number of the D flip-flops of the clock detecting circuit 62 is not limited to three and may be another number, such as one, two, or more than three. A truth table of each of the D flip-flops 72, 74, and 76 is the same. Taking the D flip-flop 74 as an example, when the voltage level of the second enable signal ENout transmitted to the reset end $\overline{R}$ is low, the D flip-flop 74 does not work. However, when the voltage level of the second enable signal ENout transmitted to the reset end $\overline{R}$ is high, the D flip-flop 74 is triggered by the raising edge of the output signal CK. On other hand, when the voltage level of the second enable signal ENout is high, and the rising edge of the output signal CK is detected, the output end Q of the D flip-flop 74 outputs a value of the data input end D thereof. Moreover, the voltage level of the detection result signal Sc outputted by the third logic circuit 78 is low when the voltage levels of the output ends Q of the D flip-flops 72, 74, and 76 are all high. Accordingly, when the oscillator 10 is triggered to oscillate, and the output signal CK thereof does not have pulses, the voltage level of the detection result signal Sc is high. However, when the rising edge of the third pulse of the output signal CK is detection by the D flip-flops 72, 74, and 76, the voltage level of the detection result signal Sc is low. As a result, through the D flip-flops 72, 74, and 76, a counter is formed to determine whether the number of waves of the output signal CK of the oscillator 10 within the predetermined period reaches a predetermined value or not. When the number of waves of the output signal CK within the predetermined period reaches the predetermined value, it means that the oscillator 10 steadily oscillates. On the contrary, if the number of waves of the output signal CK within the predetermined period is smaller than the predetermined value, it means that the oscillator 10 does not steadily oscillate yet. In this situation, the voltage level of the second enable signal ENout is indirectly adjusted to trigger the oscillator 10 according to the detection result signal Sc.

The pulse width circuit 56 has three first inverters 82, 84, and 86 connected in series, wherein an input end of the first inverter 82 is coupled to the output end of the second logic circuit 66, and an output end of the first inverter 86 is coupled to one of the two input ends of a NOR gate 88 of the pulse width circuit 56. The other one of the two input ends of the NOR gate 88 is directly coupled to the output end of the second logic circuit 66. The first inverters 82, 84, and 86 are used to output an inverted signal Si after inverting the regulating signal Sn. Generally, the inverted signal Si follows the regulating signal Sn in timing. Moreover, the NOR gate 88 outputs an inverted pulse width signal So according to the regulating signal Sn and the inverted signal Si. The pulse width circuit 56 further comprises a second inverter 90. An input end of the second inverter 90 is coupled to the output end of the NOR gate 88, and the second inverter 90 inverts the inverted pulse width signal So to output the above-described pulse width signal Sb. It should be noted that, in the present embodiment, the number of the first inverters is three but is not limited in the present invention. In order to make the inverted signal Si to be a signal inverted from the delayed regulating signal Sn, the number of the first inverters of the pulse width circuit 56 is odd.

Figure 8:
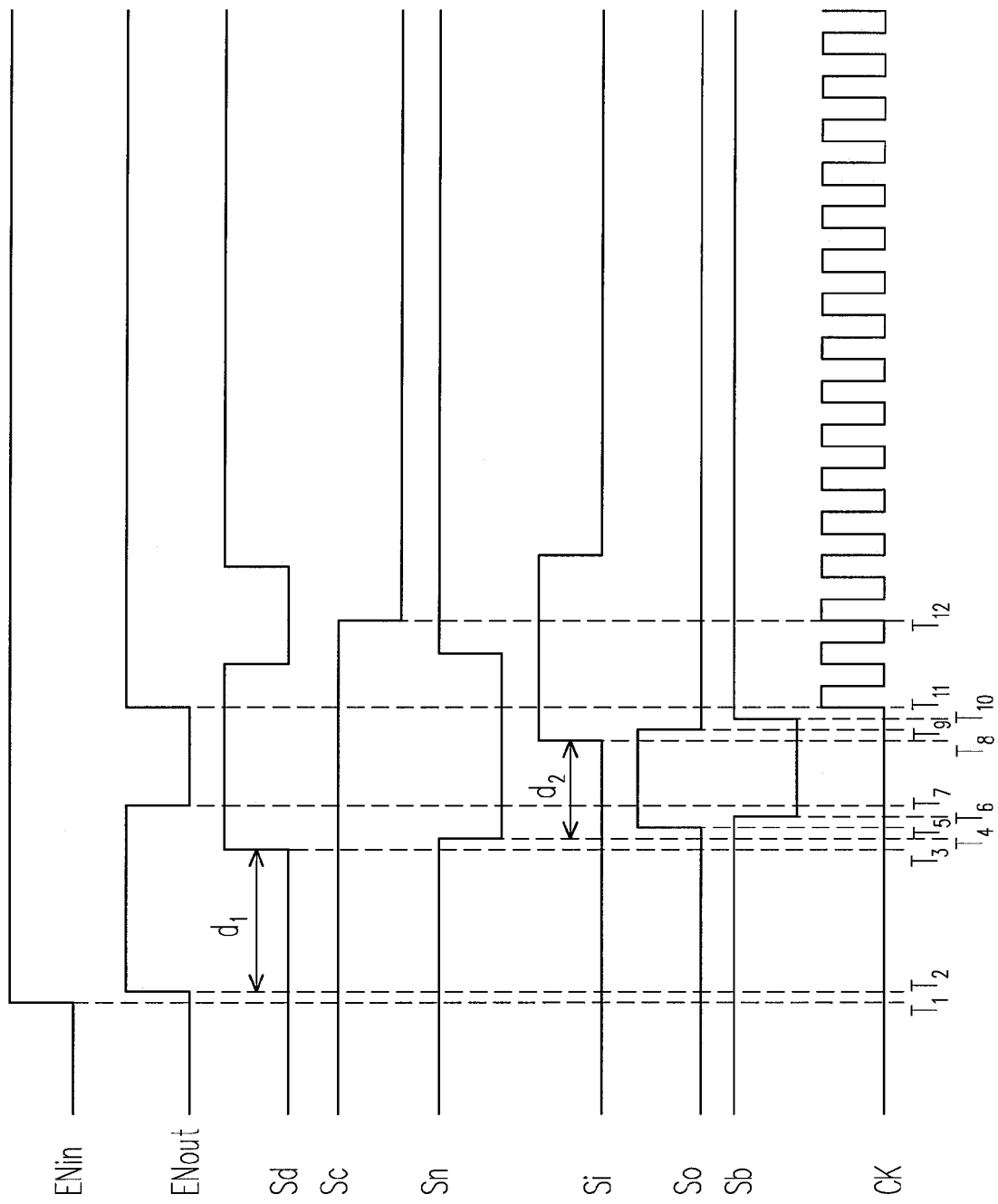
FIG. 8 is a timing diagram of each of the signals of the oscillation circuit in FIG. 7.

FIG. 8 is a timing diagram of each of the signals of the oscillation circuit in FIG. 7. Referring to FIG. 7 and FIG. 8, at a time $T_1$, the voltage level of the first enable signal ENin is raised from the low voltage level to the high voltage level, so that the oscillation circuit of FIG. 7 stays at the enable state. Thereafter, due to the delayed response time of the first logic circuit 52, the second enable signal ENout is raised from the low voltage level to the high voltage level at a later time $T_2$. The delay circuit 64 outputs the delay signal Sd after delaying the second enable signal ENout for a first delay time $d_1$, so that the delay signal Sd is raised to the high voltage level at a time $T_3$. Moreover, according to the above description related to the clock detecting circuit 62, before a time $T_{11}$, since the output signal CK does not have pulses yet, the voltage level of the detection result signal Sc outputted by the clock detecting circuit 62 is high. The second logic circuit 66 performs a NAND operation according to the detection result signal Sc and the delay signal Sd and lowers the regulating signal Sn from the high voltage level to the low voltage level at a time $T_4$. The first inverters 82, 84, and 86 output the inverted signal Si after delaying the regulating signal Sn for a second delay time $d_2$ and inverting the regulating signal Sn. Accordingly, the inverted signal Si falls behind the regulating signal Sn for the second delay time $d_2$. As shown in FIG. 8, the inverted signal Si is raised to be at the high voltage level at a time $T_8$, and the period from the time $T_4$ to the time $T_8$ is the above-described second delay time $d_2$. The time frame of the second delay time $d_2$ positively correlates with the number of the first inverters of the pulse width circuit 56. That is, the more the number of the first inverters of the pulse width circuit 56 is, the longer the time frame of the second delay time $d_2$ is. The NOR gate 88 raises the inverted pulse width signal So to be at the high voltage level at a time $T_5$ according to the regulating signal Sn and the inverted signal Si and lowers the inverted pulse width signal So to be at the low voltage level at a time $T_9$. The second inverter 90 inverts the inverted pulse width signal So, lowers the pulse width signal Sb to be at the low voltage level at a time $T_6$, and further lowers the second enable signal ENout from the high voltage level to the low voltage level at a time $T_7$. Thereafter, the pulse width signal Sb is raised to be at the high voltage level at the time $T_9$, and the first logic circuit 52 raises the second enable signal ENout to be at the high voltage level at a time $T_{10}$. As a result, the voltage level of the second enable signal ENout stays at the low voltage level during the period from the time $T_7$ to the time $T_{11}$. Furthermore, since the voltage level of the second enable signal ENout is raised to the high voltage level at the time $T_{11}$, the oscillator 10 is triggered to oscillate. Thereafter, when the oscillator 10 generates the third pulse of the output signal CK, since the clock detecting circuit 62 detects the rising edge of the third pulse of the output signal CK, the clock detecting circuit 62 lowers the detection result signal Sc to be at the low voltage level at a time $T_{12}$.

In brief, when the regulating circuit 54 does not detect the pulse of the output signal CK during the period from the time $T_2$ to the time $T_3$, the control unit 50 lowers the second enable signal ENout to be at the low voltage level during the period from the time $T_7$ to the time $T_{11}$ through the first logic circuit 52, the regulating circuit 54, and the pulse width circuit 56 according to the inputted first enable signal ENin and the output signal CK and further forms a pulse of the second enable signal ENout. Due to the variation of voltage levels of the second enable signal ENout, it is possible that the oscillator 10 which fails to oscillate can be again triggered to oscillate.

To sum up, according to the external first enable signal and the output signal of the oscillator, the oscillation circuit generates the second enable signal having the function of triggering the internal oscillator in the embodiments of the present invention. Accordingly, in terms of circuit structure, the oscillation circuit generates the second enable signal capable of triggering the internal oscillator according to the received first enable signal and the output signal fed back from the oscillator in the embodiments of the present invention. The oscillation circuit in the embodiments of the present invention can be applied to a variety of electrical apparatus. Particularly, for some electrical apparatuses of which the oscillators are not apt to be triggered to oscillate, such as a flash memory apparatus having an embedded USB interface, the driving circuit in the embodiments of the present invention can be applied to trigger these oscillators to oscillate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driving circuit adapted to trigger an oscillator to oscillate, the driving circuit comprising:
    a control unit;
    a first input end, coupled to the control unit, adapted to receive a first enable signal;
    a second input end, coupled to the control unit, adapted to receive an output signal of the oscillator; and
    an output end coupled to the control unit and an enable end of the oscillator to transmit a second enable signal generated by the control unit to the oscillator,
    wherein the control unit generates the second enable signal according to the first enable signal and the output signal, and when a number of waves of the output signal within a predetermined period is smaller than a predetermined value, the control unit adjusts a voltage level of the second enable signal;
    wherein the control unit comprises:
    a first logic circuit having two input ends and one output end, wherein one of the two input ends of the first logic circuit receives the first enable signal, the other one of the two input ends of the first logic circuit receives a pulse width signal, and the first logic circuit performs a logic operation according to the first enable signal and the pulse width signal to output the second enable signal from the output end of the first logic circuit;
    a regulating circuit having two input ends and one output end, wherein one of the two input ends of the regulating circuit is coupled to the output end of the first logic circuit to receive the second enable signal, the other one of the two input ends of the regulating circuit is coupled to the oscillator to receive the output signal, and the regulating circuit generates and outputs a regulating signal according to the output signal and the second enable signal; and
    a pulse width circuit adapted to convert the regulating signal to the pulse width signal, wherein an input end of the pulse width circuit is coupled to the output end of the regulating circuit, and an output end of the pulse width circuit outputs the pulse width signal to the first logic circuit;
    wherein the first logic circuit is an AND gate.

2. The driving circuit as claimed in claim 1, wherein when the number of waves of the output signal within the predetermined period is smaller than the predetermined value, the control unit generates at least one pulse of the second enable signal.

3. The driving circuit as claimed in claim 1, wherein the regulating circuit comprises:
    a clock detecting circuit having two input ends and one output end, wherein one of the two input ends of the clock detecting circuit is coupled to the output end of the first logic circuit to receive the second enable signal, the other one of the two input ends of the clock detecting circuit is coupled to the oscillator to receive the output signal, and the clock detecting circuit detects whether the number of waves of the output signal within the predetermined period is smaller than the predetermined value or not according to the second enable signal and outputs a detection result signal from the output end of the clock detecting circuit according to a detection result;
    a delay circuit adapted to delay the second enable signal to output a delay signal; and
    a second logic circuit having two input ends and one output end, wherein one of the two input ends of the second logic circuit receives the detection result signal, the other one of the two input ends of the second logic circuit receives the delay signal, and the second logic circuit performs another logic operation according to the detection result signal and the delay signal to output the regulating signal from the output end of the second logic circuit.

4. The driving circuit as claimed in claim 3, wherein the clock detecting circuit comprises at least one D flip-flop, a reset end of the at least one D flip-flop receives the second enable signal, and a clock input end of the at least one D flip-flop receives the output signal.

5. The driving circuit as claimed in claim 4, wherein the clock detecting circuit comprises a third logic circuit and a plurality of the D flip-flops, the reset end of each of the D flip-flops receives the second enable signal, the clock input end of each of the D flip-flops receives the output signal, an output end of each of the D flip-flops is coupled to the third logic circuit, and the output end of at least one of the D flip-flops is coupled to a data input end of another one of the D flip-flops.

6. The driving circuit as claimed in claim 5, wherein each of the second logic circuit and the third logic circuit is a NAND gate.

7. The driving circuit as claimed in claim 1, wherein the pulse width circuit comprises:
    at least one first inverter, wherein an input end thereof is coupled to the output end of the regulating circuit, and the at least one first inverter outputs an inverted signal after inverting the regulating signal;
    a NOR gate having two input ends and one output end, wherein one of the two input ends of the NOR gate is coupled to the output end of the regulating circuit, the other one of the two input ends of the NOR gate is coupled to an output end of the at least one first inverter, and the NOR gate outputs an inverted pulse width signal according to the regulating signal and the inverted signal; and a second inverter, wherein an input end thereof is coupled to the output end of the NOR gate, and the second inverter outputs the pulse width signal after inverting the regulating signal.

8. The driving circuit as claimed in claim 7, wherein the pulse width circuit comprises a plurality of the first inverters, the first inverters are connected in series, and the number of the first inverters is odd.

9. The driving circuit as claimed in claim 1, wherein a voltage level of the first enable signal is equal to an enable voltage level during the predetermined period.

10. An oscillation circuit, comprising:
an oscillator adapted to output an output signal; and
a driving circuit comprising:
a control unit;
a first input end, coupled to the control unit, adapted to receive a first enable signal;
a second input end, coupled to the control unit, adapted to receive the output signal; and
an output end coupled to the control unit and an enable end of the oscillator to transmit a second enable signal generated by the control unit to the oscillator,
wherein the control unit generates the second enable signal according to the first enable signal and the output signal, and when a number of waves of the output signal within a predetermined period is smaller than a predetermined value, the control unit adjusts a voltage level of the second enable signal;
wherein the control unit comprises:
a first logic circuit having two input ends and one output end, wherein one of the two input ends receives the first enable signal, the other one of the two input ends receives a pulse width signal, and the first logic circuit performs a logic operation according to the first enable signal and the pulse width signal to output the second enable signal from the output end of the first logic circuit;
a regulating circuit having two input ends and one output end, wherein one of the two input ends of the regulating circuit is coupled to the output end of the first logic circuit to receive the second enable signal, the other one of the two input ends of the regulating circuit is coupled to the oscillator to receive the output signal, and the regulating circuit generates and outputs a regulating signal according to the output signal and the second enable signal; and
a pulse width circuit adapted to convert the regulating signal to the pulse width signal, wherein an input end of the pulse width circuit is coupled to the output end of the regulating circuit, and an output end of the pulse width circuit outputs the pulse width signal to the first logic circuit;
wherein the first logic circuit is an AND gate.

11. The oscillation circuit as claimed in claim 10, wherein when the number of waves of the output signal within the predetermined period is smaller than the predetermined value, the control unit generates at least one pulse of the second enable signal.

12. The oscillation circuit as claimed in claim 10, wherein the regulating circuit comprises:
a clock detecting circuit having two input ends and one output end, wherein one of the two input ends of the clock detecting circuit is coupled to the output end of the first logic circuit to receive the second enable signal, the other one of the two input ends of the clock detecting circuit is coupled to the oscillator to receive the output signal, and the clock detecting circuit detects whether the number of waves of the output signal within the predetermined period is smaller than the predetermined value or not according to the second enable signal and outputs a detection result signal from the output end of the clock detecting circuit according to a detection result;
a delay circuit adapted to delay the second enable signal to output a delay signal; and
a second logic circuit having two input ends and one output end, wherein one of the two input ends of the second logic circuit receives the detection result signal, the other one of the two input ends of the second logic circuit receives the delay signal, and the second logic circuit performs another logic operation according to the detection result signal and the delay signal to output the regulating signal from the output end of the second logic circuit.

13. The oscillation circuit as claimed in claim 12, wherein the clock detecting circuit comprises at least one D flip-flop, a reset end of the at least one D flip-flop receives the second enable signal, and a clock input end of the at least one D flip-flop receives the output signal.

14. The oscillation circuit as claimed in claim 13, wherein the clock detecting circuit comprises a third logic circuit and a plurality of the D flip-flops, the reset end of each of the D flip-flops receives the second enable signal, the clock input end of each of the D flip-flops receives the output signal, an output end of each of the D flip-flops is coupled to the third logic circuit, and the output end of at least one of the D flip-flops is coupled to a data input end of another one of the D flip-flops.

15. The oscillation circuit as claimed in claim 14, wherein each of the second logic circuit and the third logic circuit is a NAND gate.

16. The oscillation circuit as claimed in claim 10, wherein the pulse width circuit comprises:
at least one first inverter, wherein an input end thereof is coupled to the output end of the regulating circuit, and the first inverter outputs an inverted signal after inverting the regulating signal;
a NOR gate having two input ends and one output end, wherein one of the two input ends of the NOR gate is coupled to the output end of the regulating circuit, the other one of the two input ends of the NOR gate is coupled to the output end of the first inverter, and the NOR gate outputs an inverted pulse width signal according to the regulating signal and the inverted signal; and
a second inverter, wherein an input end thereof is coupled to the output end of the NOR gate, and the second inverter outputs the pulse width signal after inverting the regulating signal.

17. The oscillation circuit as claimed in claim 16, wherein the pulse width circuit comprises a plurality of the first inverters, the first inverters are connected in series, and the number of the first inverters is odd.

18. The oscillation circuit as claimed in claim 10, wherein a voltage level of the first enable signal is equal to an enable voltage level during the predetermined period.

19. A driving method of an oscillator adapted to trigger the oscillator to oscillate, the driving method comprising:
receiving a first enable signal by using a first input end of a driving circuit;

receiving an output signal of the oscillator by using a second input end of the driving circuit;

enabling a control unit of the driving circuit according to the first enable signal;

generating a regulating signal by a regulating circuit of the enabled control unit according to the output signal and a second enable signal;

converting the regulating signal to a pulse width signal by a pulse width circuit of the enabled control unit;

performing an AND logic operation by an AND gate of the enabled control unit according to the first enable signal and the pulse width signal to output the second enable signal, such that a voltage level of the second enable signal is adjusted when a number of waves of the output signal within a predetermined period is smaller than a predetermined value; and transmitting the second enable signal from an output end of the driving circuit to the oscillator.

20. The driving method as claimed in claim 19, wherein the step of generating the second enable signal comprises:

when the number of waves of the output signal within the predetermined period is smaller than the predetermined value, generating at least one pulse of the second enable signal by using the control unit.

21. The driving method as claimed in claim 19, wherein a voltage level of the first enable signal is equal to an enable voltage level during the predetermined period.

* * * * *